(12) United States Patent
Zheng et al.

(10) Patent No.: US 8,310,830 B2
(45) Date of Patent: *Nov. 13, 2012

(54) ELECTRONIC DEVICE AND FREQUENCY CONVERTER OF MOTOR

(75) Inventors: Li Zheng, Beijing (CN); Elvir Redzepovic, Soenderborg (DK); Henrik Rosendal Andersen, Graasten (DK)

(73) Assignee: Danfoss Drives A/S, Graasten (DK)

( * ) Notice: Subject to any disclaimer, the term of this patent is extended or adjusted under 35 U.S.C. 154(b) by 335 days.

This patent is subject to a terminal disclaimer.

(21) Appl. No.: 12/518,526

(22) PCT Filed: Dec. 10, 2007

(86) PCT No.: PCT/DK2007/000542
§ 371 (c)(1),
(2), (4) Date: Apr. 9, 2010

(87) PCT Pub. No.: WO2008/071192
PCT Pub. Date: Jun. 19, 2008

(65) Prior Publication Data
US 2010/0202109 A1    Aug. 12, 2010

(30) Foreign Application Priority Data

Dec. 11, 2006    (CN) .......................... 2006 1 0165938

(51) Int. Cl.
*H05K 7/20* (2006.01)
*F28F 7/00* (2006.01)
*H01L 23/34* (2006.01)

(52) U.S. Cl. ....... 361/697; 361/709; 165/80.3; 257/722; 363/141

(58) Field of Classification Search ............. 361/679.47–679.49, 697, 703, 361/709, 719; 165/80.2–80.3, 185; 257/713, 257/722; 174/16.3, 547; 363/141; 454/184
See application file for complete search history.

(56) References Cited

U.S. PATENT DOCUMENTS 5,091,823 A    2/1992    Kanbara et al.
(Continued)

FOREIGN PATENT DOCUMENTS

DE    93 20 825.1    4/1995
(Continued)

OTHER PUBLICATIONS

U.S. Appl. No. 12/518,571, filed Jun. 10, 2009.
(Continued)

*Primary Examiner* — Zachary M Pape
(74) *Attorney, Agent, or Firm* — McCormick, Paulding & Huber LLP

(57) ABSTRACT

A frequency converter for driving a motor, includes a circuit board, having at least one first heat-generating element mounted thereon; a heat sink, connected to the at least one first heat-generating element; a fan, facing the heat sink; and a bracket, for positioning the at least one heat-generating element relative to the heat sink and the circuit board. The frequency converter includes a separating member for separating at least one portion of at least one second heat-generating element from the circuit board to prevent the cooling air guided to the at least one second heat-generating element from flowing to the circuit board. The frequency converter includes an airflow guiding member for guiding the cooling air from the fan to the heat sink and the at least one second heat-generating element and a flow guiding gate dispensing more airflow to the region corresponding to the at least one first heat-generating element.

16 Claims, 13 Drawing Sheets

U.S. PATENT DOCUMENTS

| | | | |
|---|---|---|---|
| 5,485,350 A | | 1/1996 | Hecht et al. |
| 5,694,294 A | | 12/1997 | Ohashi et al. |
| 5,757,638 A | * | 5/1998 | Katooka et al. ............... 363/146 |
| 5,793,608 A | | 8/1998 | Winick et al. |
| 6,091,604 A | * | 7/2000 | Plougsgaard et al. ........ 361/707 |
| 6,292,363 B1 | | 9/2001 | Shinohara et al. |
| 6,320,776 B1 | * | 11/2001 | Kajiura et al. ................ 363/141 |
| 6,665,183 B1 | | 12/2003 | Shikata et al. |
| 7,120,018 B2 | | 10/2006 | Shen et al. |
| 7,405,932 B2 | | 7/2008 | Vinson et al. |
| 7,663,882 B2 | | 2/2010 | Li et al. |
| 7,746,648 B2 | * | 6/2010 | Yamada et al. ............... 361/715 |
| 7,755,902 B2 | | 7/2010 | Peng et al. |
| 8,081,453 B2 | | 12/2011 | Sun |
| 2002/0064028 A1 | | 5/2002 | Nielsen et al. |
| 2003/0043541 A1 | * | 3/2003 | Yuasa et al. .................. 361/687 |
| 2004/0061992 A1 | | 4/2004 | Roman et al. |
| 2004/0223301 A1 | | 11/2004 | Muller et al. |
| 2006/0067048 A1 | | 3/2006 | Yu et al. |
| 2006/0067050 A1 | | 3/2006 | Li et al. |
| 2006/0067051 A1 | | 3/2006 | Ku |
| 2006/0114652 A1 | | 6/2006 | Jory et al. |
| 2008/0041562 A1 | | 2/2008 | Bhatia |
| 2010/0157531 A1 | | 6/2010 | Mason et al. |

FOREIGN PATENT DOCUMENTS

| | | |
|---|---|---|
| EP | 0 356 991 A2 | 3/1990 |
| EP | 0 951 208 A3 | 4/2000 |
| JP | 2002-320392 | 10/2002 |
| WO | WO 03/041471 A1 | 5/2003 |
| WO | 2006/069570 A1 | 7/2006 |

OTHER PUBLICATIONS

PCT Search Report for Serial No. PCT/DK2007/00539 dated May 6, 2008.

PCT Search Report for Serial No. PCT/DK2007/00542 dated Mar. 5, 2008.

* cited by examiner

ELECTRONIC DEVICE AND FREQUENCY CONVERTER OF MOTOR

CROSS REFERENCE TO RELATED APPLICATIONS

This application is entitled to the benefit of and incorporates by reference essential subject matter disclosed in International Patent Application No. PCT/DK2007/000542 filed on Dec. 10, 2007 and Chinese Patent Application No. 200610165938.4 filed Dec. 11, 2006.

TECHNICAL FIELD

The present invention relates to an electronic device and a frequency converter of motor for controlling the rotating speed of a motor, in particular, to an improvement of the cooling method of a frequency converter of motor, which can effectively isolate and cool a heat-generating member on a circuit board, so as to reduce its temperature and prevent the other elements on the circuit board from being contaminated by the impurity in cooling air. Such frequency converter of motor can be an alternating current (AC) or direct current (DC) frequency converter of motor.

BACKGROUND ART

FIG. 1 is a schematic view showing a non-closed type forced cooling frequency converter in the prior art. As shown in FIG. 1, the conventional frequency converter of motor blows the cooling air to a heat sink 202 using a fan 201, and it also blows the cooling air to each elements in the circuit board simultaneously, resulting in the impurities in the air blown into the circuit board and contaminating internal devices, pins and pads, so that each elements in the circuit board has a potential risk to be short-circuit or damaged. Meanwhile, the safety distance between respective elements in the circuit board depends on the contamination degree that the circuit board might suffer, i.e., the more contamination, the greater safety distance is required, which adversely affect the size reduction of the frequency converter.

FIG. 2 is a schematic view showing a frequency converter in which main heat-generating element and a part of secondary heat-generating elements are forced cooled while the other secondary heat-generating elements are natural cooled. As shown in FIG. 2, the conventional frequency converter of motor usually employs a combination cooling method of the fan forced cooling and the natural cooling through heat-dissipating holes, i.e. the power element such as the Insulating Gate Bipolar Transistor (IGBT) is forced cooled by the heat sink 202 and the fan 201, while the secondary heat-generating elements are natural cooled or a small amount of wind is blown to capacitors 111 and coils etc. Thus, poor heat dissipation for elements may reduce lifetime of the elements, thereby resulting in reduction of the lifetime of the whole frequency converter of motor.

In the frequency converter of the prior art, there is no effective thermal insulation measures to be taken between main heat-generating element and other elements on the circuit board, as well as between the heat sink and the circuit board, and the heat conduction of the main heat-generating element and the heat sink may still make other elements on the circuit board to operate under high temperature.

In addition, aligning connection is performed between IGBT and the heat sink and between IGBT and the circuit board, which is generally achieved via aligning holes on the circuit board, the heat sink and IGBT. However, in the assembly process, IGBT is usually adhered to the backboard of the heat sink by heat conductive silica gel, and then pressed on the circuit board. However adhering IGBT on the heat sink may cause position deflection and rotation, thereby influencing the alignment between IGBT, the heat sink and the circuit board.

Therefore, it is necessary that each heat-generating elements of the frequency converter of motor is effectively heat-dissipated, and the heat-generating elements are heat insulated with other elements on the circuit board, so as to improve operation quality and lifetime of the product. Also, the problem of aligning positioning between IGBT and the heat sink and the circuit board need be solved.

SUMMARY OF THE INVENTION

Thereby, the present invention, directing to the above problems, provides a frequency converter for driving a motor, comprising: a circuit board, having at least one first heat-generating element mounted thereon; a heat sink, connected to the at least one first heat-generating element; a fan, facing the heat sink; and a bracket, for positioning the at least one heat-generating element relative to the heat sink and the circuit board.

According to the frequency converter for driving a motor of the present invention, the bracket further comprises a heat insulation member for separating the heat sink and the circuit board, so as to thermally insulate the heat sink and the circuit board.

The frequency converter for driving a motor according to the present invention further comprising: at least one second heat-generating element having a main body protruding from the circuit board; and an airflow guiding member placed between the fan and the heat sink, for guiding the cooling air flowed from the fan to the heat sink and at least one portion of the at least one second heat-generating element respectively.

The frequency converter for driving a motor according to the present invention further comprising a separating member for separating the at least one portion of the main body of the at least one second heat-generating element from the circuit board, so as to prevent the cooling air guided to the at least one second heat-generating element from flowing to the circuit board.

According to the frequency converter for driving a motor of the present invention, the heat insulation member is disposed in parallel with the backboard of the heat sink, and spaced apart by a predetermined distance.

According to the frequency converter for driving a motor of the present invention, a heat insulation film is disposed on the backboard of the heat sink, the heat insulation film comprises insulating materials.

According to the frequency converter for driving a motor of the present invention, the heat sink defines a first airflow passage, and the separating member defines a second airflow passage in which the at least one portion of the main body of the at least one second heat-generating element is positioned, so that the cooling air guided to the at least one second heat-generating element flows through the second airflow passage, and cools the at least one portion of the main body of the at least one second heat-generating element.

According to the frequency converter for driving a motor of the present invention, the second airflow passage has an inlet hole adjacent to the airflow guiding member and an outlet hole for guiding the airflow out of the frequency converter.

According to the frequency converter for driving a motor of the present invention, the airflow guiding member, the separating member the heat insulation member and the bracket are integrally formed of the same insulating materials.

According to the frequency converter for driving a motor of the present invention, the airflow guiding member and the second airflow passage are configured as a streamline shape to eliminate vortex.

According to the frequency converter for driving a motor of the present invention, a conductive member is further provided on the separating member to eliminate electromagnetic interference. The conductive member may be formed of metal material different from the material for the heat sink. Alternatively the conductive member may be a conductive film layer formed on at least one portion of the separating member.

According to the frequency converter for driving a motor of the present invention, the heat sink may have a fin-like shape, and comprises a plurality of fin plates substantially extending in parallel for defining the first airflow passage between each fin plates, the first airflow passage comprises an inlet end adjacent to the fan and an outlet end for guiding the airflow out of the frequency converter.

According to the frequency converter for driving a motor of the present invention, the heat sink may be provided with an inlet hole on the backboard of the inlet end, and an outlet hole on the backboard of the outlet end, so as to form an airflow passage between the heat sink and the heat-resistant region; alternatively, the backboard of the inlet end of the heat sink is separated from the heat-resistant region by a predetermined distance to form an inlet gap, and the backboard of the outlet end of the heat sink is separated from the heat-resistant region by a predetermined distance to form an outlet gap, so as to form an airflow passage between the heat sink and the heat-resistant region.

According to the frequency converter for driving a motor of the present invention, the fan and the inlet end are spaced apart by a predetermined distance to reduce wind resistance.

The frequency converter for driving a motor according to the present invention further comprising a metal sheet matching with the separating member, which on one hand functions as an electromagnetic proof member, and on the other hand defines a second airflow passage together with the separating member, at least one portion of the main body of the at least one second heat-generating element being positioned in the second airflow passage, so that the cooling air guided to the at least one second heat-generating element flows through the second airflow passage.

According to the frequency converter for driving a motor of the present invention, the second airflow passage has an inlet hole adjacent to the airflow guiding member and an outlet hole for guiding the airflow out of the frequency converter.

The frequency converter for driving a motor according to the present invention further comprises a flow guiding gate disposed between the fan and the heat sink for guiding the airflow from the fan to the heat sink, and dispensing more airflow to flow through the heat concentrating region in the first airflow passage.

According to the frequency converter for driving a motor of the present invention, the at least one first heat-generating element comprises at least one IGBT, and the at least one second heat-generating element comprises at least one capacitor; the at least one first heat-generating element further comprises metal oxide semiconductor field effect transistor, and the at least one second heat-generating element further comprises a coil.

According to the frequency converter for driving a motor of the present invention, the bracket comprises an insulating wall surrounding the at least one first heat-generating element for thermally insulate the at least one first heat-generating element from the elements on the circuit board therearound.

The present invention further provides an electronic device, comprising: a circuit board having a first heat-generating element mounted thereon; a heat sink connected to the at least one first heat-generating element; a fan facing the heat sink; and a bracket, for positioning the at least one heat-generating element relative to the heat sink and the circuit board.

The electronic device according to the present invention comprises a heat insulation member for thermally insulating the heat sink and the circuit board.

According to the electronic device of the present invention, the heat insulation member and the heat sink are disposed in parallel each other, and spaced apart by a predetermined distance therebetween.

According to the electronic device of the present invention, a heat insulation film is disposed on the heat sink.

BRIEF DESCRIPTION OF DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Figure 1:
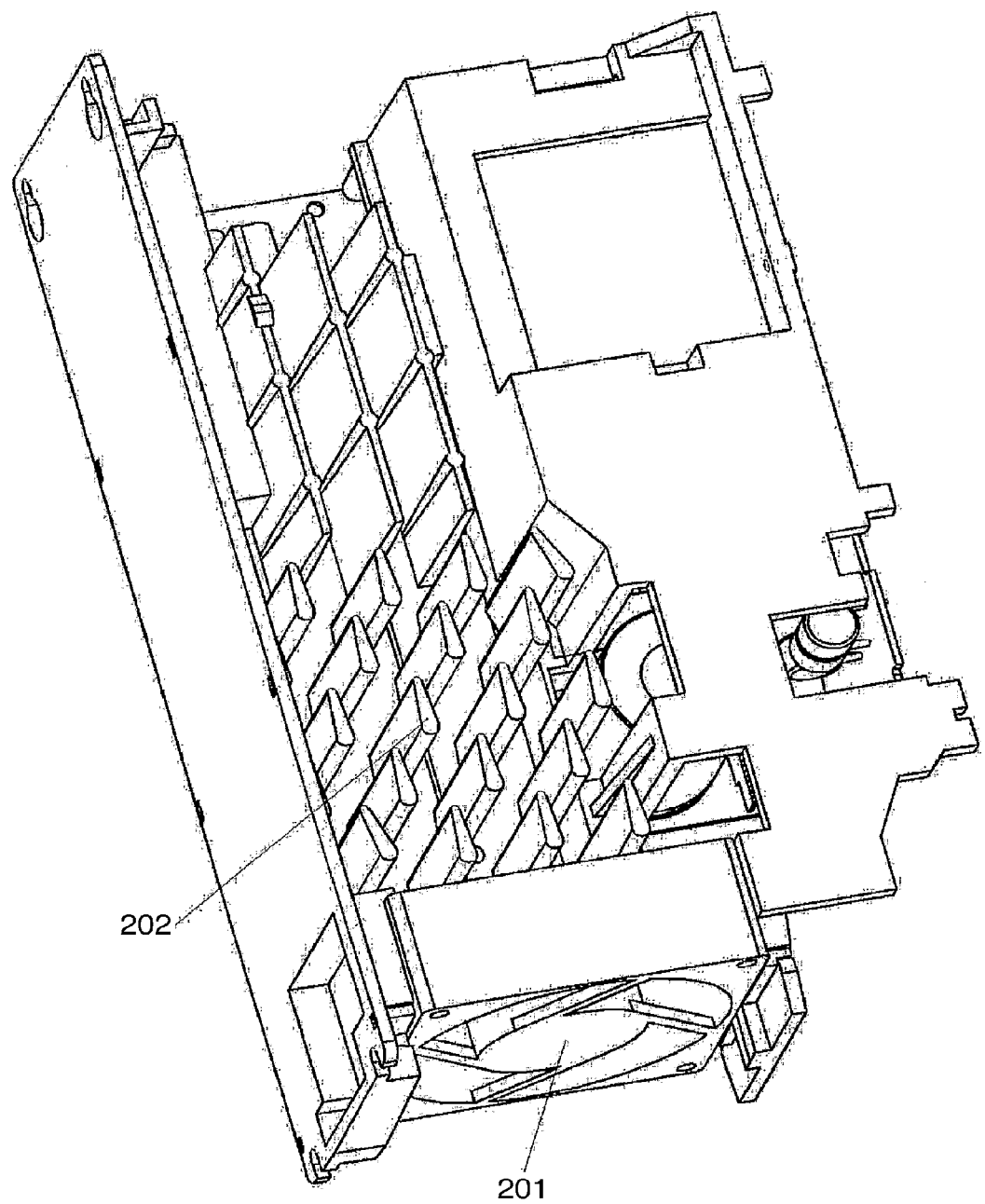
FIG. 1 is a schematic view showing a non-closed type forced cooling frequency converter in the prior art.
Figure 2:
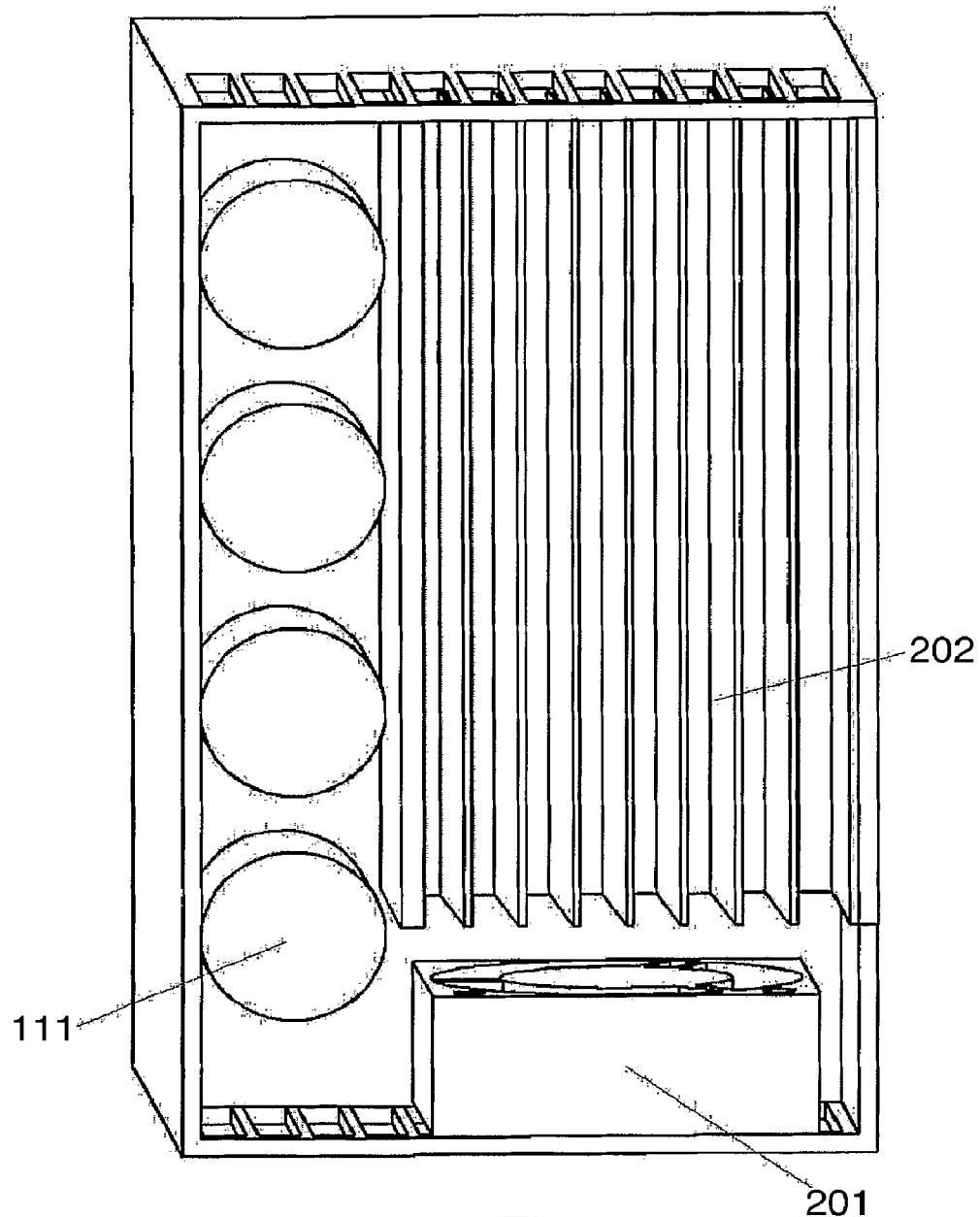
FIG. 2 is a schematic view showing a frequency converter in the prior art in which main heat-generating element and part of secondary heat-generating elements are forced cooled while the other secondary heat-generating elements are natural cooled.

Exemplary embodiments of the present invention will now be described more fully hereinafter below in more detail with reference to the accompanying drawings, wherein like reference numerals refer to the like elements throughout. This invention may, however, be embodied in different forms and should not be construed as limited to the embodiments set forth herein. "Another embodiment" mentioned in multiple places in the context is not necessarily refers to the same embodiment.

The First Embodiment

Figure 3:
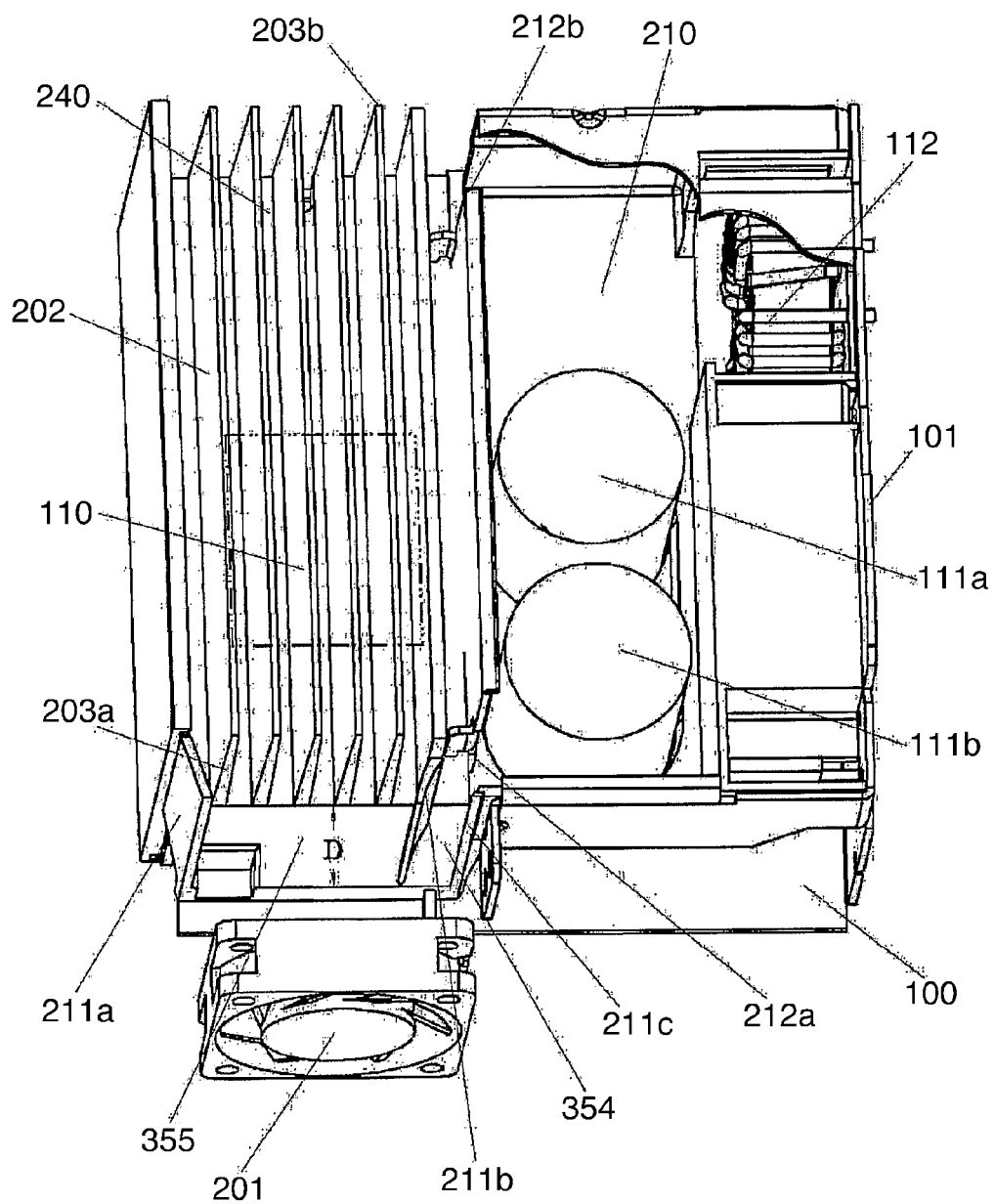
FIG. 3 is a schematic view showing an electronic device according to the first embodiment of the present invention.

The first embodiment of the present invention is described by illustrating an example of the frequency converter used for driving a motor. FIG. 3 is a schematic view showing an electronic device according to the first embodiment of the present invention. Referring to FIG. 3, at least one first heat-generating element 110, such as Insulating Gate Bipolar transistor (IGBT) module consisted of a plurality of IGBT and metal oxide semiconductor field effect transistor, are mounted on the circuit board 100. The IGBT module may have single IGBT or a plurality of IGBTs separately packaged, or may further comprise other functional elements, such as a metal oxide semiconductor field effect transistor etc. The at least one first heat-generating element 110 is connected to a heat sink 202 so as to be cooled. The heat sink 202 can be formed by aluminum extrusion or aluminum casting. Second heat-generating elements, such as a plurality of capacitors 111a, 111b and a coil 112 shown in FIG. 3, are mounted on the circuit board 100. The capacitors could be electrolytic capacitor with cylinder shape for example. A sub circuit board 101 may further be amounted on the circuit board 100, and the coil 112 may be amounted on the sub circuit board 101. However, the present invention is not limited thereto, and the coil 112 may also be amounted on the circuit board 100.

Referring to FIG. 3 again, a fan 201 is amounted on a side adjacent to the heat sink 202 to provide cooling air to the heat sink 202, so as to cool the IGBT module 110 connected to the heat sink 202. The electronic device of the present invention has airflow guiding members 211a, 211b and 211c, through which the airflow from the fan 201 is blown to the heat sink 202, the capacitors 111a, 111b and the coil 112 respectively. Here, IGBT module 110 is the main heat-generating element (hereafter called the first heat-generating element), while capacitors 111a, 111b and coil 112 are the secondary heat-generating elements (hereafter called the second heat-generating element), thereby the airflow guiding members 211a, 211b and 211c dispenses most of the airflow to the heat sink 202, and dispenses the rest to the capacitors 111a, 111b and coil 112. The airflow dispensed to the heat sink 202 enters into the heat sink 202 from the inlet end 203a of the heat sink, and discharges out of the heat sink through the outlet end of the heat sink 202. The airflow dispensed to capacitors 111a, 111b and coil 112 flows to the capacitors 111a, 111b and coil 112 through the inlet hole 212a, and discharges out of the electronic device through the outlet hole 212b.

Referring to FIG. 3, there is a gap D between the fan 201 and the inlet end 203a of the heat sink 202, which can reduce the wind resistance of the airflow from the fan 201 effectively. Also, the gap D make it easier for the airflow guiding members 211a, 211b and 211c to be disposed between the fan 201 and the inlet end 203a of the heat sink 202, and also allow the airflow guiding members 211a, 211b and 211c to guide and dispense the airflow effectively.

Figure 4:
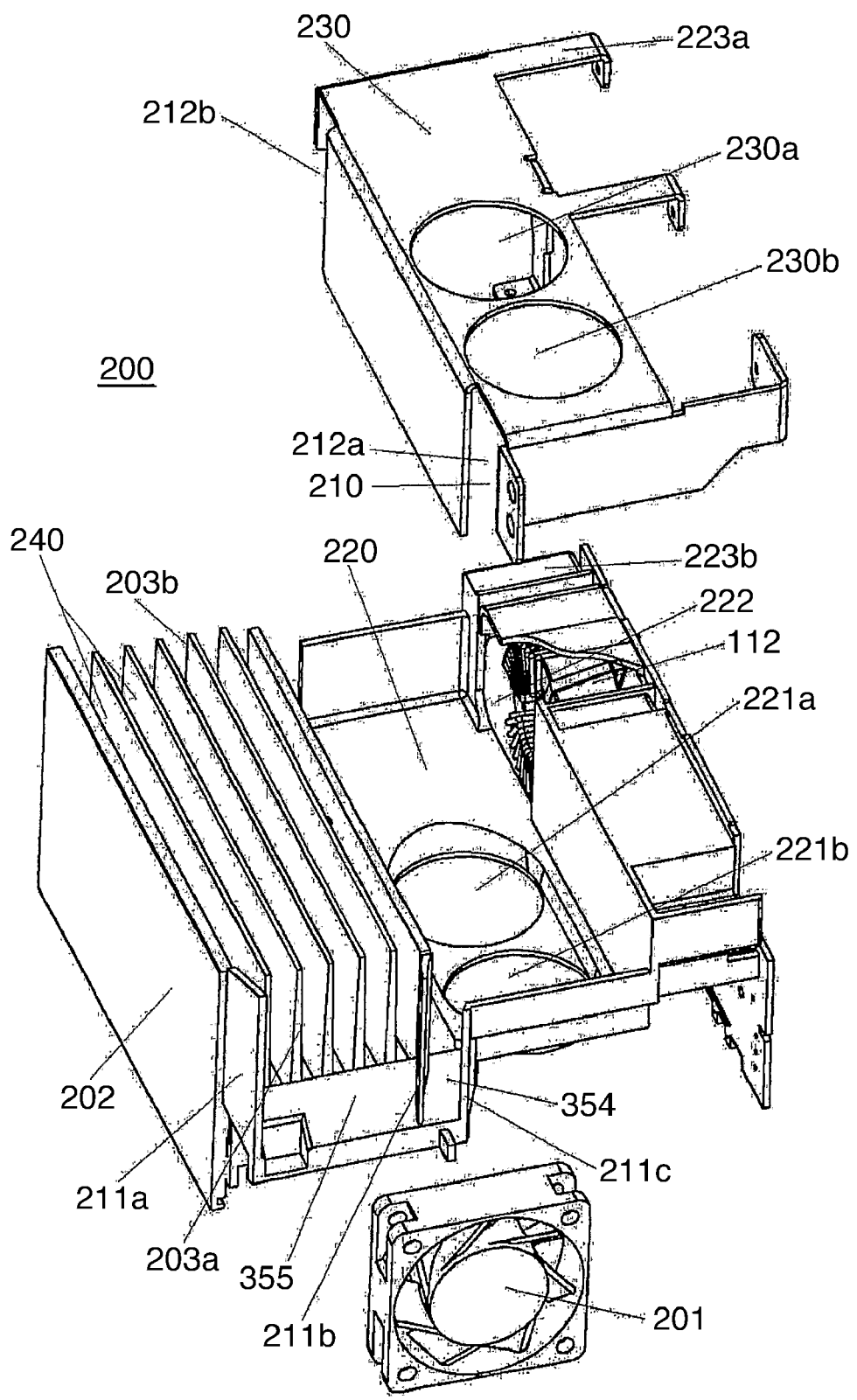
FIG. 4 is an exploded perspective view showing a frequency converter according to the first embodiment of the present invention.
Figure 5:
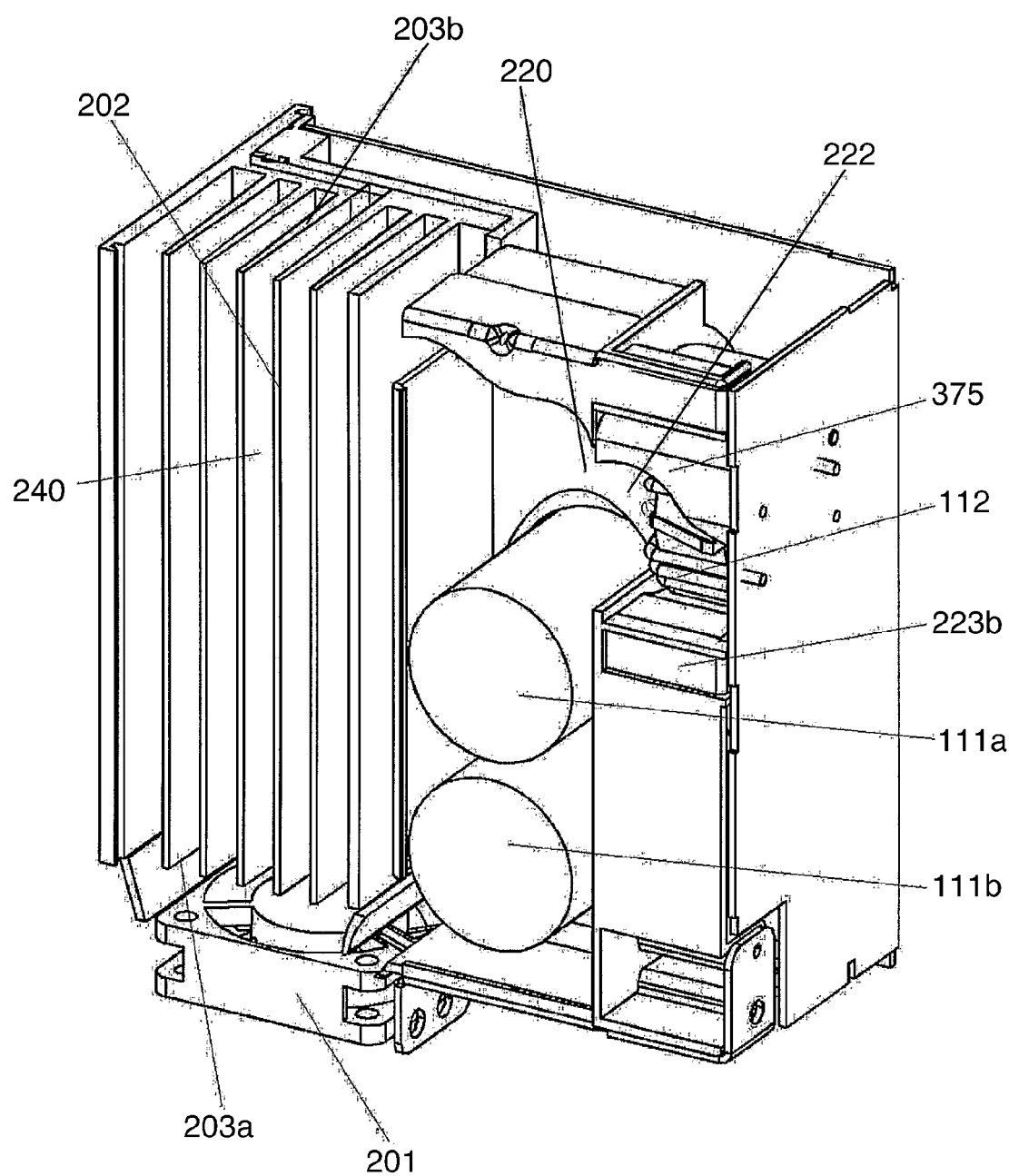
FIG. 5 is an assembly view showing a frequency converter according to the first embodiment of the present invention.

FIG. 4 is an exploded perspective view showing a frequency converter 200 according to the first embodiment of the present invention, and FIG. 5 is an assembly view showing a frequency converter 200 according to the first embodiment of the present invention. The frequency converter 200 will be described in details by referring to FIG. 4 and FIG. 5.

Referring to FIG. 4 and FIG. 5, the frequency converter 200 according to the present invention comprises: a fan 201 for supplying cool air to the frequency converter 200; a second airflow passage 210 for cooling the at least one second heat-generating element; a first airflow passage 240 for cooling the at least one first heat-generating element; and airflow guiding members 211a, 211b and 211c placed between the fan 201 and the second airflow passage 210 and the first airflow passage 240 for dispensing the cooling air from the fan 201 to the second airflow passage 210 and the first airflow passage 240.

As shown in FIG. 4, the fan 201 has a box shape with a substantially square cross-section, and is detachably mounted on the case (not shown) of the frequency converter, so as to facilitate the replacement of the fan when it is required, thereby insuring the frequency converter being forced cooled effectively, and the lifetime of the fan can not influence the lifetime of the frequency converter, since replacing the fan is equivalent to extend the lifetime of the frequency converter accordingly. The air discharging capacity of the fan 201 may be larger than or not less than that needed to dissipate heat generated from the at least one first heat-generating element 110 and the at least one second heat-generating elements 111a, 111b and 112.

Referring to FIG. 4, the second airflow passage 210 according to the first embodiment of the present invention is preferably formed of two portions. One is a lower body 220 formed of insulating materials, such as a polymer, which is a part of the separating member of a frequency converter for driving a motor so as to separate a main body of the second heat-generating element 111a, 111b and 112 or at least one part of it from said circuit board in a closed manner; and the other is an upper body 230 formed of, for example, a metal sheet, which also functions as a conductive member of the frequency converter for driving a motor so as to ground the frequency converter, thereby eliminating electromagnetic interference.

Referring to FIG. 4, the upper body 230 has a metal sheet with substantially "L"-shaped cross-section formed by pressing. A substantial box shape case is formed by assembling the upper body 230 having "L"-shaped cross-section with the lower body 220, and which are joined together by a connecting member, such as a clip and a buckle formed on the lower body 220 and the upper body 230 respectively. However, the present invention is not limited thereto, for example, the inner surface of the second airflow passage 210 may be designed as a curve shape, such as streamline shape from the inlet hole 212a to the outlet hole 212b, so as to reduce airflow resistance to increase the efficiency of heat dissipation.

Referring to FIG. 4, an inlet hole 212a is formed on the side of the second airflow 210 corresponding to the outlet end of the secondary air passage 354. The airflow blown to the secondary air passage 354 by the fan 201 enters into the second airflow passage 210 through the inlet hole 212a. An outlet hole 212b is formed at the other end on the side of the second airflow passage 210 on which the inlet hole 212a is positioned. The outlet hole 212b gathers the airflow flowing through the second airflow passage 210 and the airflow flowing through the heat sink 202 together to discharge it to the outside through the outlet hole on the case. Alternatively, the outlet hole may also be disposed on the other side of the second airflow passage 210 to discharge the airflow flowing through the second airflow passage 210 and the airflow flowing through the heat sink 202 to the outside respectively.

Referring to FIG. 4, openings 221a and 230a, and 221b and 230b corresponding to each other are formed on the lower body 220 and the upper body 230 of the second airflow passage 210 at the position corresponding to the upper and lower plates of capacitors 111a and 111b, the shape and size of the openings 221a and 230a, and 221b and 230b correspond to the cross-section shape and size of the capacitors 111a and 111b, so that a part of the capacitors 111a and 111b protrude into the second airflow passage through the openings 221a and 230a, and 221b and 230b. The height of the part of the capacitors 111a and 111b protruding into the second airflow passage is preferably larger than or as least equal to 50% of the total height of the capacitors 111a and 111b. In other words, the height of the second airflow passage 210 is preferably larger than 50% of the height of the capacitors 111a and 111b, and the top surface of the second airflow passage 210 and the top surface of the capacitors 111a and 111b are disposed at the same level, in order to insure more than 50% of the side surface of the capacitors positioned in the effective cooling region of the second airflow 210. After the capacitors 111a and 111b are mounted in the openings 221a and 230a, a sealing process, such as using a seal gasket, can be carried out between the lower body 220 and the capacitors 111a and 111b, in order to prevent impurities in the second airflow passage 210 from flowing in the circuit board on which the capacitors 111a and 111b are mounted, thereby preventing the other elements on the circuit board from being contaminated or damaged. The capacitors 111a and 111b protrude through the openings 230a and 230b to a level at which the top surface of the upper body 230 is positioned, and are fixed on the top surface of the upper body 230 by insulating adhesive, such as epoxy resin, to prevent short circuit between. The capacitors 111a and 111b and the top surface. The capacitors 111a and 111b may not protrude to the top surface of the upper body 230, in this case, the part protruding above the lower body 220 is completely accommodated in the second airflow passage 210, and it is not necessary to dispose openings on the upper body 230 at the position corresponding to the capacitors 111a and 111b. A good heat dissipating effect can be achieved even when only the top surface of the capacitors can protrude into the second airflow passage 210.

As shown in FIG. 5, an opening 222 is formed on the sidewall of the second airflow passage 210 at the position corresponding to the coil 112. The coil 112 is accommodated in a coil cover 375, and is mechanically/electrically connected to the circuit board with the coil cover 375 serving as an insulating layer therebetween. The coil cover 375 has a sidewall, so as to form a coil cover with one opening end. Because the shape and size of the opening 222 can correspond to the shape and size of the opening end of the coil cover 375, the inner space of the coil cover 375 becomes a part of the second airflow passage 210 after the coil cover 375 is air-tightly connected to the opening 222 of the second airflow passage 210. The heat generated from the coil 112 is exchanged with the airflow flowing in the second airflow passage 210 through the opening 222, and discharges to the outside through an outlet 212b. However, the present invention is not limited thereto, for example, the coil 112 can protrude into the second airflow passage 210 from the sub circuit board 101, so as to eliminating the pieces such as the coil cover 375. And the coil 112 may also be disposed on the circuit board 100, and protrudes into the second airflow passage 210 through the opening on the lower body 220 at the position corresponding to the coil 112.

Referring to FIG. 4, a plurality of side arms 223a extending from the upper body 230 of the second airflow passage 210 formed of a metal at a proper position, as a conductive member of the frequency converter, is electrically connected with the heat sink 202 and a plurality of ground ends of the circuit board to achieve the grounding of the whole frequency converter to eliminate electromagnetic interference. Also, a plurality of side arms 223b are formed on the lower body 220 of the second airflow passage 210 formed of a polymer, and they correspond to the plurality of side arms 223a on the upper body 230 of the second airflow passage 210 formed of a metal. After the lower body and the upper body 220 and 230 are assembled together, the side arms 223a and 223b are bonded to each other to increase the mechanical strength of the plurality of side arms for grounding.

Referring to FIG. 4, an airflow guiding member 211 is disposed adjacent to the outlet of the fan 201. The airflow guiding member 211 comprises side airflow guiding members 211a and 211c and a main airflow guiding member 211b. An inlet of a substantial trapezoid airflow passage surrounded by the side airflow guiding members 211a and 211c corresponds to the outlet of the fan 201, an outlet of a main airflow passage 355 surrounded by the side guiding member 211a and the main airflow guiding member 211b corresponds to the inlet of the heat sink 202, an outlet of a secondary airflow passage 354 surrounded by the side airflow guiding member 211c and the main airflow guiding member 211b corresponds to the inlet hole 212a of the second airflow passage 210.

The airflow guiding member 211a, 211b and 211c at least has the following effects: forming the main airflow passage 355 from the fan 201 to the heat sink 202; forming the secondary airflow passage 354 from the fan 201 to the second airflow passage 210; forming a streamline smoothing surfaces of the main airflow passage 355 and the secondary airflow passage 354 with different sizes, in order to reduce powder consumption due to air vortex.

The position and angle of the main airflow guiding member 211b being disposed directly influent an amount of the airflow dispensed to the main airflow passage 355 and the secondary airflow passage 354 and the direction of the airflow flowing in the secondary airflow passage 354. Preferably, the inlet of the main airflow guiding member 211b is disposed to closely contact with the outlet of the fan 201, and a contact line (or stripe-like plane) thereof divides the outlet of the fan 201 into a region corresponding to the main airflow passage 355 and a region corresponding to the secondary airflow passage 354, and the area ratio of the region corresponding to the main airflow passage 355 to the region corresponding to the secondary airflow passage 354 is substantially equal to the air throughput ratio of the main airflow passage 355 to the secondary airflow passage 354. Preferably, the outlet end of the main airflow guiding member 211b is disposed to correspond to an end surface of a side fin of the heat sink 202 adjacent to at least one second heat-generating element, and the secondary airflow passage 354 substantially corresponds to the at least one second heat-generating element 111a and 111b. Preferably, the main airflow guiding member 211b is formed with a streamline cross-section, and its two side surfaces are fluid-like smoothing surface. In the preferred embodiment of the present invention, the main airflow guiding member 211b and the side airflow guiding members 211a and 211c are integrally formed of a polymer. The airflow guiding members 211a, 211b and 211c and the lower body 220 of the second airflow passage 210 may integrally be formed of the same materials. Alternatively, the airflow guiding members 211a, 211b and 211c may also be formed separately, or the main airflow guiding member 211b in the airflow guiding members 211a, 211b and 211c may be formed separately and then is adhered to the side airflow guiding members 211a and 211c or an end face of a side wall of the heat sink 202 by such as adhesive.

As shown in FIG. 5, the first airflow passage 240 is a closed airflow passage formed by the heat sink 202 and the case (not shown). The heat sink 240 may be fin-shaped formed by aluminum extrusion or aluminum casting. However, the present invention is not limited thereto, for example, the heat sink may be formed into any kind of shapes adapted to form an airflow passage for forced cooling. The heat sink comprises a plurality of fin plates extending substantially in parallel with each other, so as to define the first airflow passage 240 between each fin plates. The first airflow passage 240 comprises an inlet end 203a adjacent to the fan and an outlet end 203b for guiding the airflow out of the electronic device.

The at least one first heat-generating element of the frequency converter, such as an IGBT model, is disposed to contact the backboard of the heat sink 202 tightly by such as heat conductive silica gel, so that the heat from the at least one first heat-generating element may be insured to be dissipated by the heat sink 202 under forced cooling of the fan 201.

The Second Embodiment

The second embodiment of the present invention has substantially the same structure as that of the first embodiment except the separating member 220 and the conductive member 230. Therefore, the separating member 220 and the conductive member 230 of the second embodiment will mostly be described hereafter, and thereby omitting the same description with the first embodiment.

Figure 6:
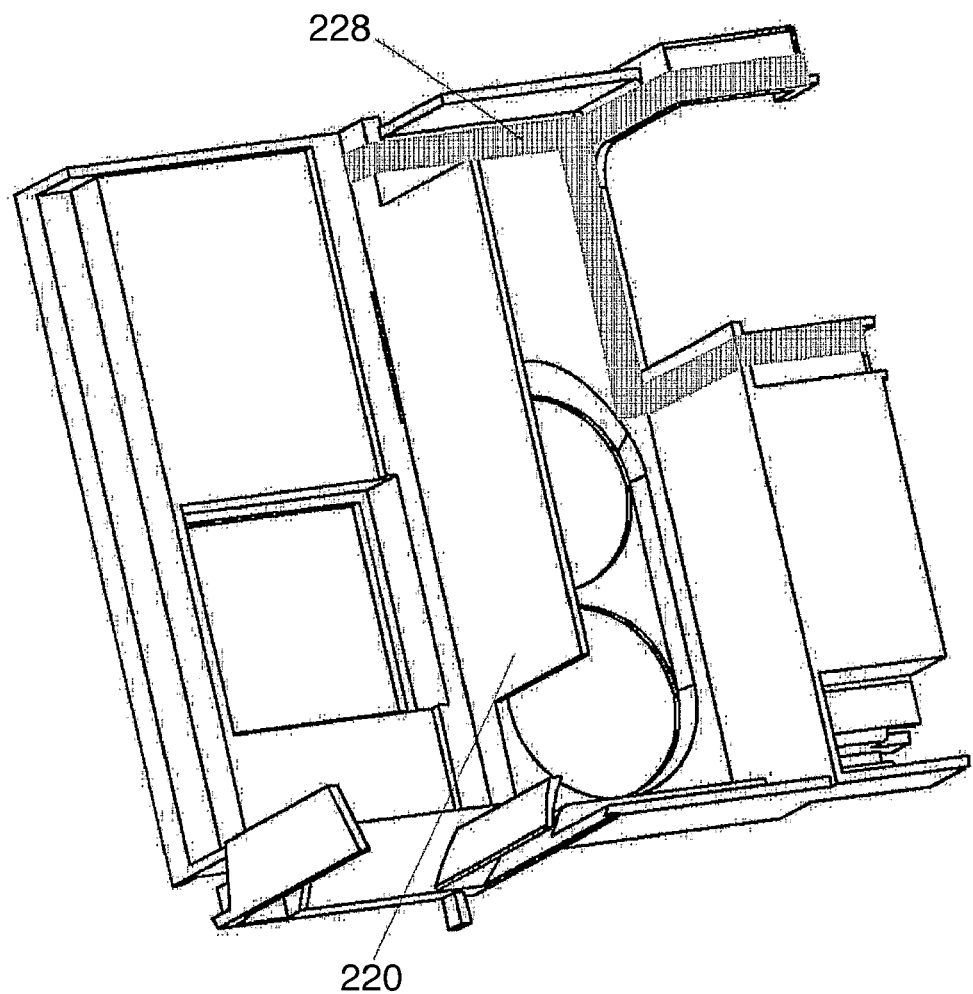
FIG. 6 is a schematic view showing an electronic device according to the second embodiment of the present invention.

FIG. 6 is a schematic view showing an electronic device according to the second embodiment of the present invention.

Referring to FIG. 6, in the second embodiment of the present invention, the separating member 220 is formed with a rectangle box shape, which is substantially the same as that of the second airflow passage of the first embodiment. Therefore, the separating member 220 has two functions: one is to separate a main body of the at least one second heat-generating element on the circuit boards 100 and 101 or at least one portion of the main body from the other elements on the circuit board; the other is to define a second airflow passage of the electronic device, instead of defining the second airflow passage by both the separating member 220 and the conductive member 230 in the first embodiment, so that at least one second heat-generating member, such as capacitors 111a and 111b and coil 112 in the electronic device or at least a portion thereof protrude into the second airflow passage. Thus, the purpose for cooling the at least one second heat-generating element is achieved while insuring that the cooling air can not enter into the circuit boards 100 and 101, thereby preventing the impurities in the cooling air from contaminating the other elements on the circuit boards 100 and 101 and short circuit malfunction therefrom.

Referring FIG. 6, in the second embodiment of the present invention, the conductive member 230 may be formed of a metal sheet on the separating member 220 with a shape adapted to ground the frequency converter. Alternatively, the conductive member 230 may be formed, for example, by coating a metal film on at least one part of the separating member 220.

The Third Embodiment

The third embodiment of the present invention has the same structure as that of the first embodiment and the second embodiment except the bracket of the at least one first heat generating element and the separating member. Therefore, the bracket of the third embodiment will be described hereafter, and thereby omitting the same description with the first embodiment and the second embodiment.

Figure 7A:
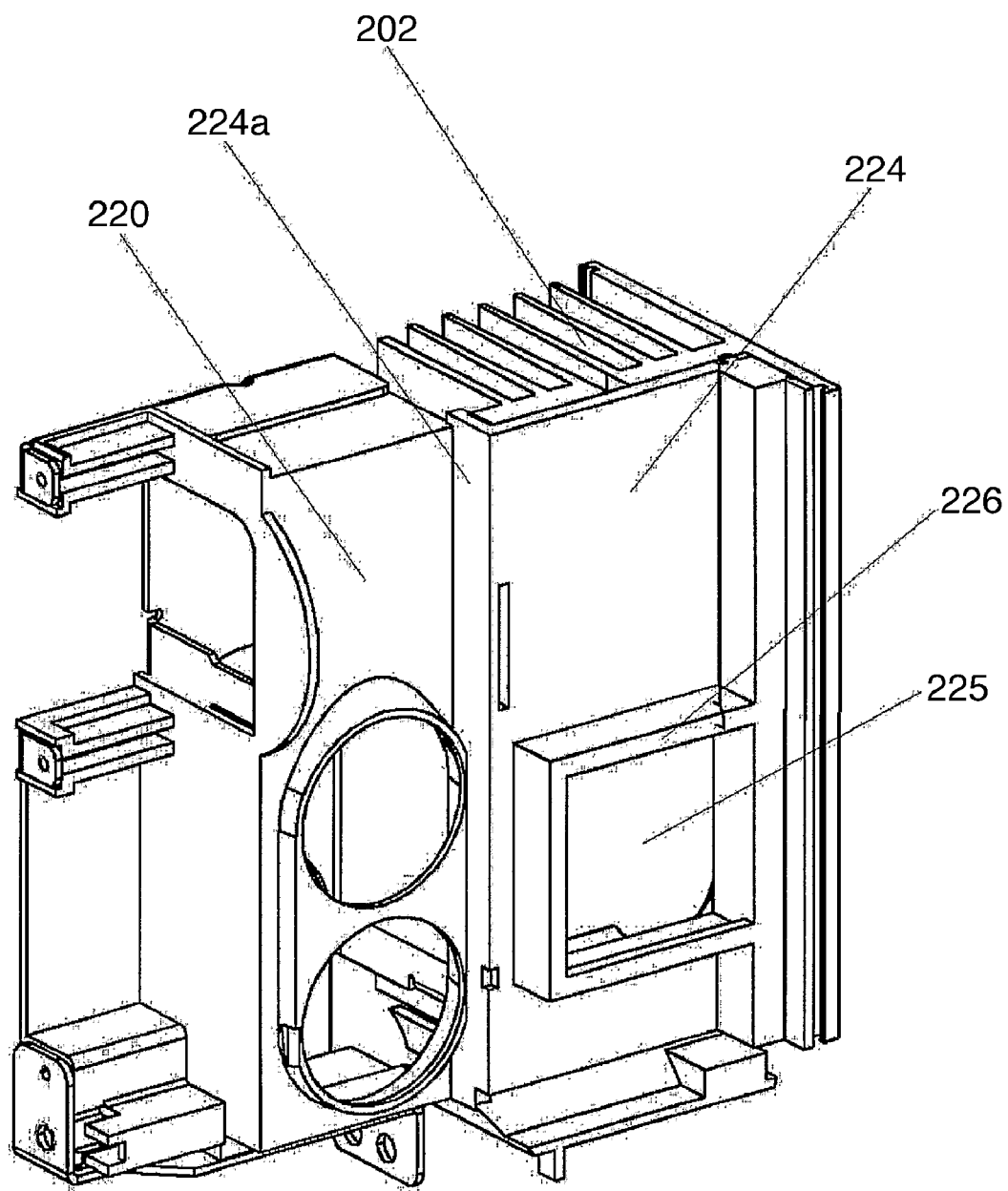
FIG. 7A is a bottom view of the bracket of the frequency converter according to the third embodiment of the present invention.
Figure 7B:
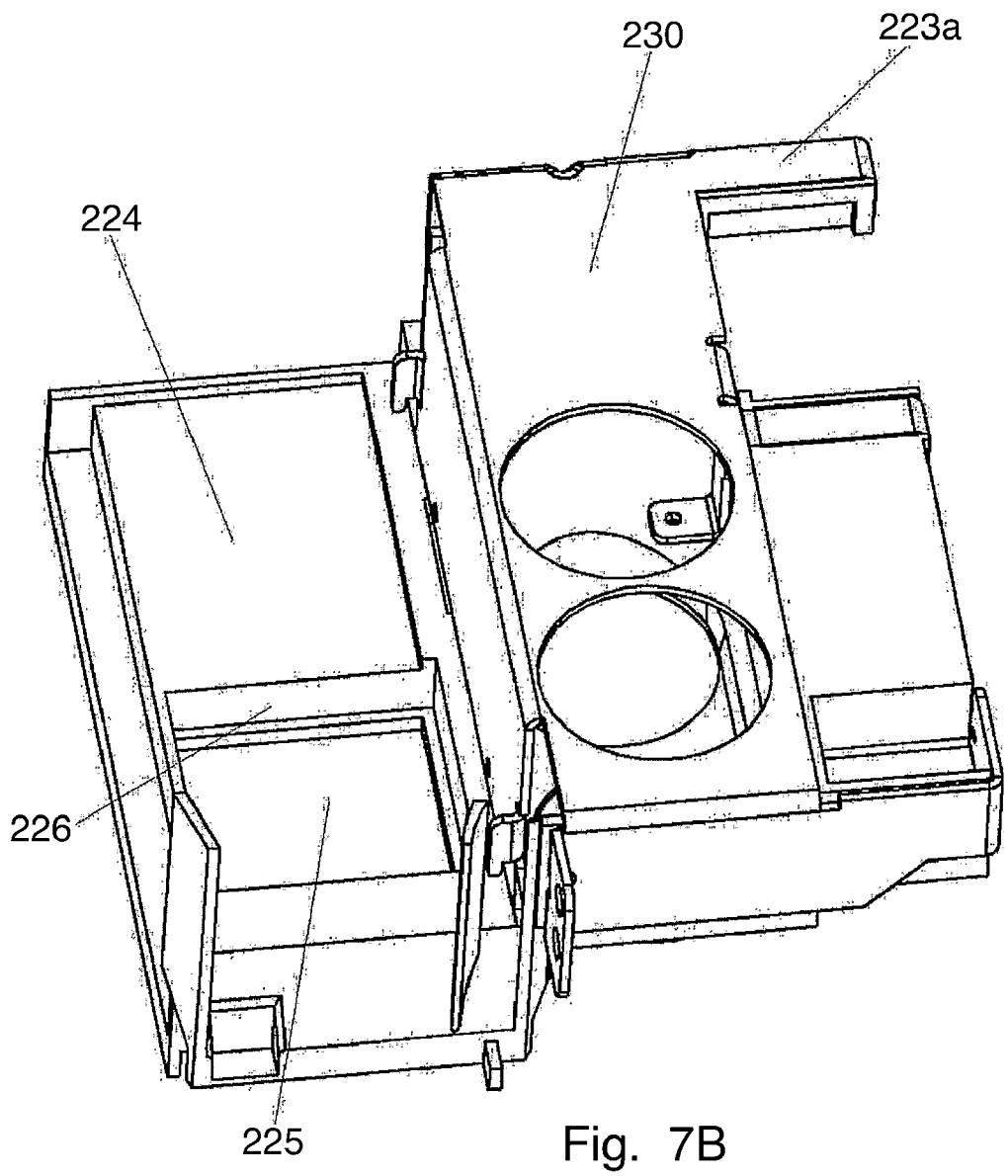
FIG. 7B is a top view of the bracket of the frequency converter according to the third embodiment of the present invention.

FIG. 7A is a bottom view of the bracket 226 and the heat insulation member 224 of the frequency converter according to the third embodiment of the present invention, and FIG. 7B is a top view of the bracket 226 and the heat insulation member 224 of the frequency converter according to the third embodiment of the present invention.

Referring to FIGS. 7A and 7B, the heat insulation member 224 may integrally be formed with the separating member 220, i.e. the separating member 220 may be bent downward and extends on a side of the heat sink 202 to form a sidewall 224a of the heat insulation member 224 and then continuously extends horizontally. The heat insulation member 224 is disposed between the heat sink 202 and circuit board 100 to form heat insulation between the heat sink 202 and circuit 100, so as to prevent the heat of the heat sink 202 from transferring to circuit board 100, thereby further protecting the circuit board 100.

Referring FIG. 7A, an opening 225 is formed in the heat insulation member 224 at a position corresponding to the at least one first heat-generating element 110, such as IGBT. The shape of the opening 225 corresponds to the shape of the at least one heat-generating element 110 with cross-section area of the opening slightly larger than that of the at least one heat-generating element 110, so that the at least one heat-generating element 110 make contact with the heat sink 202 through the opening.

Referring FIG. 7B again, a bracket 226 is formed around the opening 225, protruding down from the heat insulation member 224 by a height which is equal to the thickness of the at least one first heat-generating element 100. Preferably, the bracket 226 has a square cross-section corresponding to the at least one first heat-generating element 110, however, the present invention is not limited thereto, which can have a cross-section with a shape such as circle or polygon. The bracket 226 is bonded to the backboard of the heat sink 202 to define the mounting position of the at least one first heat-generating element 110, which is instrumental in the positioning of the at least one first heat-generating element 110 during the assembly process. Furthermore, the bracket 226 thermally insulates the first heat-generating element 110, such as IGBT model, from the other elements on the circuit board 100, in particular heat sensitivity elements, so as further to protect the other elements on the circuit board around the first heat-generating element 110.

The disposition of bracket 226 can also prevent the influence to the other elements around the first heat-generating element 110 even if the first heat-generating element 110 is shorted or exploded. The bracket 226 may also formed in an incomplete isolating form, depending on different structure of the circuit board 100, i.e. sidewalls of the bracket 226 may be provided at the sides corresponding to the heat sensitivity elements while sidewall of the bracket 226 is not provided at the other sides. The bracket 226 may be formed separately or may integrally be formed with the heat insulation member 224, even may integrally formed with the bracket 226, the heat insulation member 224 and the separating member 220, depending on the practical needs of the heat insulation of the electronic device.

In a preferable embodiment, only the bracket 226 is formed without the heat insulation member 224. Here, the bracket 226 may be formed separately or may integrally be formed with the separating member 220. The bracket 226 may comprise sidewall pates around the IGBT model 100 to have functions as follows: thermally insulating from the other elements therearound; positioning of the IGBT model; preventing the other elements from damage duet to the explosion of IGBT model.

In another preferable embodiment, only the heat insulation member 224 is formed without the bracket 226. The heat insulation member 224 has a structure which extends in parallel with the backboard of the heat sink 202, and an opening is disposed at the position corresponding to the IGBT model 110, so that the IGBT model 110 makes thermal contact with the heat sink 202 through the opening.

The Fourth Embodiment

The fourth embodiment of the present invention has the same structure as that of the third embodiment except the arrangement of the heat insulation member 224. Therefore, the arrangement of the heat insulation member 224 and the associated structural change thereof of the fourth embodiment will be described hereafter, and thereby omitting the same description as the third embodiment.

Figure 8A:
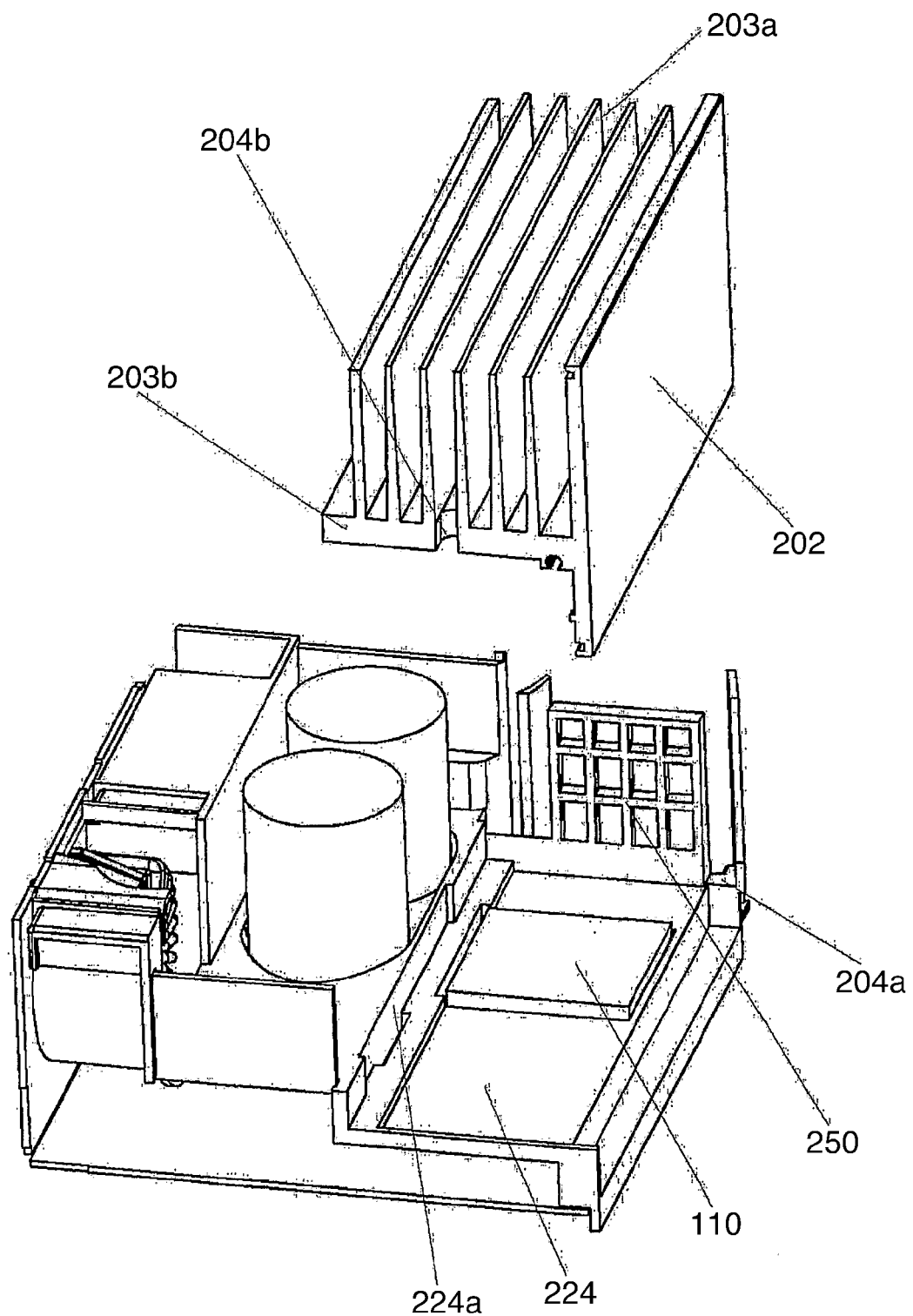
FIG. 8A is an exploded perspective view illustrating the relationship between the heat sink and the heat insulation member of the frequency converter according to the fourth embodiment of the present invention.
Figure 8B:
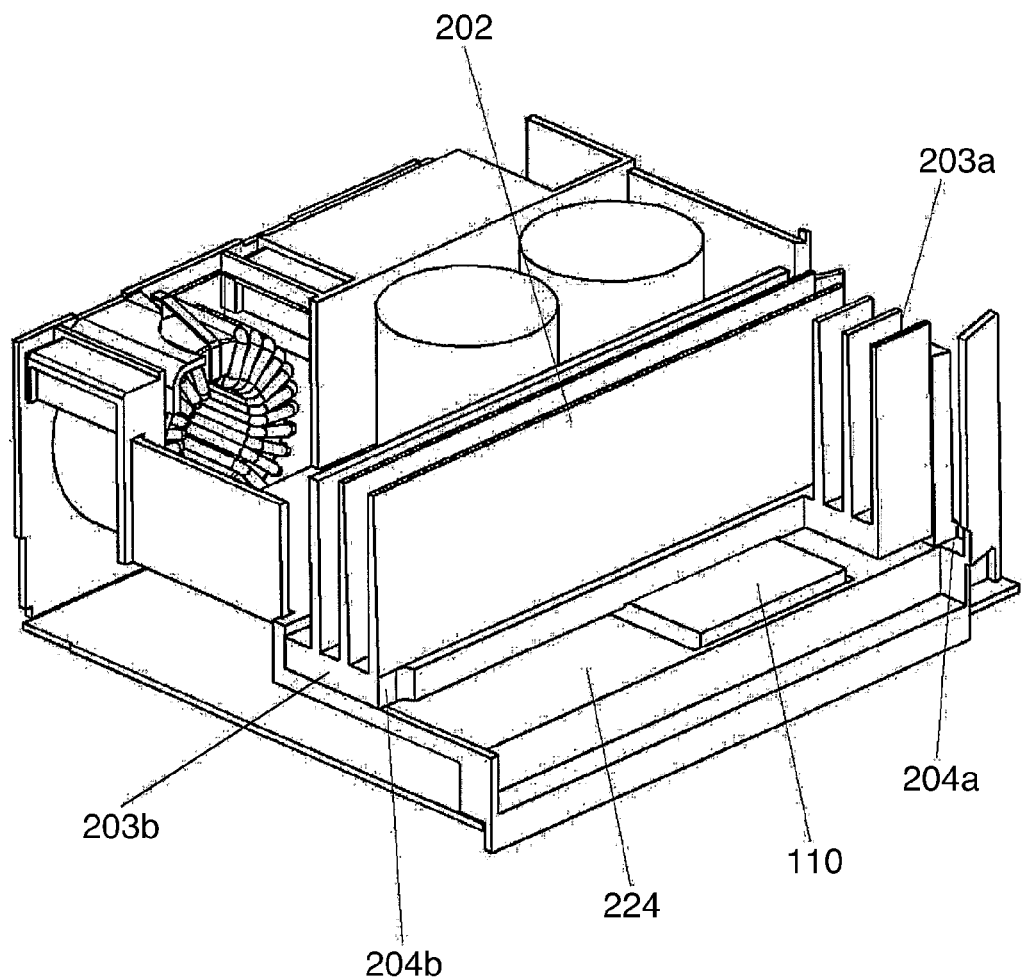
FIG. 8B is a side view of the frequency converter according to the fourth embodiment of the present invention.

FIG. 8A is an exploded perspective view illustrating the relationship between the heat sink 202 and the heat insulation member 224 of the frequency converter according to the fourth embodiment of the present invention, and FIG. 8B is a side view of the frequency converter according to the fourth embodiment of the present invention.

As shown in FIGS. 8A and 8B, in the frequency converter according to the fourth embodiment of the present invention, the heat sink 202 and the heat insulation member 224 are disposed substantially in parallel with each other with a predetermine distance therebetween. Therefore, a space is defined between the backboard of the heat sink 202 and the heat insulation member 224. The space is an excellent heat insulation layer, i.e. another heat insulation layer is formed between the heat sink 202 and circuit board 100, so as to prevent the heat of the heat sink from transferring to the elements sensitive to heat on the circuit board 100, and thereby protecting the circuit board 100. However, the heat-insulation effect of the space can not eventually be obtained unless heat is exchanged between the air in the space and the air out of the frequency converter in time. Therefore, in order to resolve this problem, in the frequency converter according to the present invention, the heat sink 202 has an inlet hole 204a at the inlet end 203a and an outlet hole 204b at the outlet end 203b. Thus, the airflow from the fan 201 is partially introduced into the heat-insulation space through the inlet hole 204a, and then is discharged out of the frequency converter through the outlet hole 204b after heat exchange therein, thereby an airflow passage is formed by the inlet hole 204a, the space between the heat sink 202 and the heat insulation member, and the outlet hole 204b. In another embodiment of the present invention, the inlet hole 204a and the outlet hole 204b can be replaced respectively by a gap formed between the backboard of the heat sink 202 at the inlet end 203a and the heat insulation member 224 and a gap formed between the backboard of the heat sink 202 at the outlet end 203b and the heat insulation member 224. That is, the present invention do not limit the structure of the above mentioned inlet hole 204a and outlet hole 204b, as long as they can functions as an air inlet and an air outlet respectively.

According to the present invention, preferably, a heat insulation film (not shown) is disposed on the backboard of the heat sink 202 at the position corresponding to the heat insulation member 224, thereby further reducing the heat transferring from the heat sink 202 to circuit board 100. The heat insulation film comprises insulating materials for example.

The Fifth Embodiment

The fifth embodiment of the present invention has the same structure as that of the first to fourth embodiments except adding a flow-guiding gate. Therefore, the flow-guiding gate of the fifth embodiment will mostly be described hereafter, and thereby omitting the same description with the first to fourth embodiment.

Figure 9:
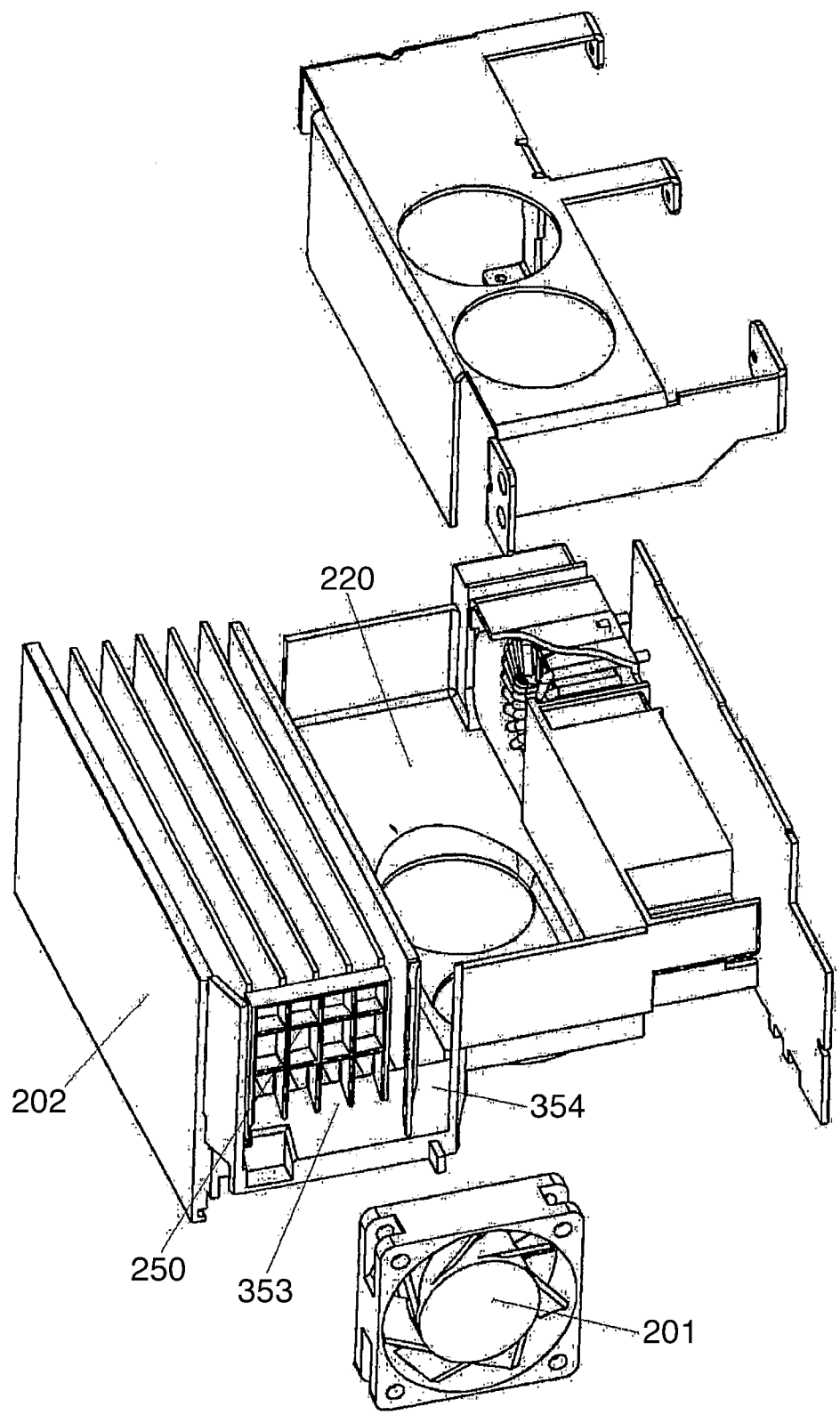
FIG. 9 is a side view of the structure of the frequency converter with flow-guiding gate according to the fifth embodiment of the present invention.

FIG. 9 is a side view of the structure of the frequency converter with flow-guiding gate according to the fifth embodiment of the present invention Referring to FIG. 9, in the frequency converter of the present invention, the flow-guiding gate 250 is provided between the fan 201 and the heat sink 202. The flow-guiding gate 250 comprises a gate plate disposed thereon for guiding the airflow from the fan 201 to the heat sink 202. The direction of the airflow through the gate plate can be adjusted by changing the angle of the gate plate, and thereby dispensing more airflow flowing through a heat concentration region in the first airflow passage, i.e. a region corresponding to IGBT model. The flow-guiding gate 250 may be made of insulating materials, and is preferably made of the same materials as that of the airflow guiding members 211a, 211b and 211c, and further preferably is integrally formed of the same materials as the airflow guiding member 211a, 211b and 211c.

Alternatively, the flow-guiding gate 250 may be disposed between the fins of the heat sink 202 between the fan 201 and the IGBT model, and an insertion-type flow-guiding gate is plugged into the space between the fins of the heat sink 202, so that the airflow flowing through the flow-guiding plates correspond to the position of the IGBT model located.

The Sixth Embodiment

The sixth embodiment of the present invention has main features as those of the first to fifth embodiments. Therefore, the combination of these main features will be described hereafter, and thereby omitting the description to the other parts.

Figure 10A:
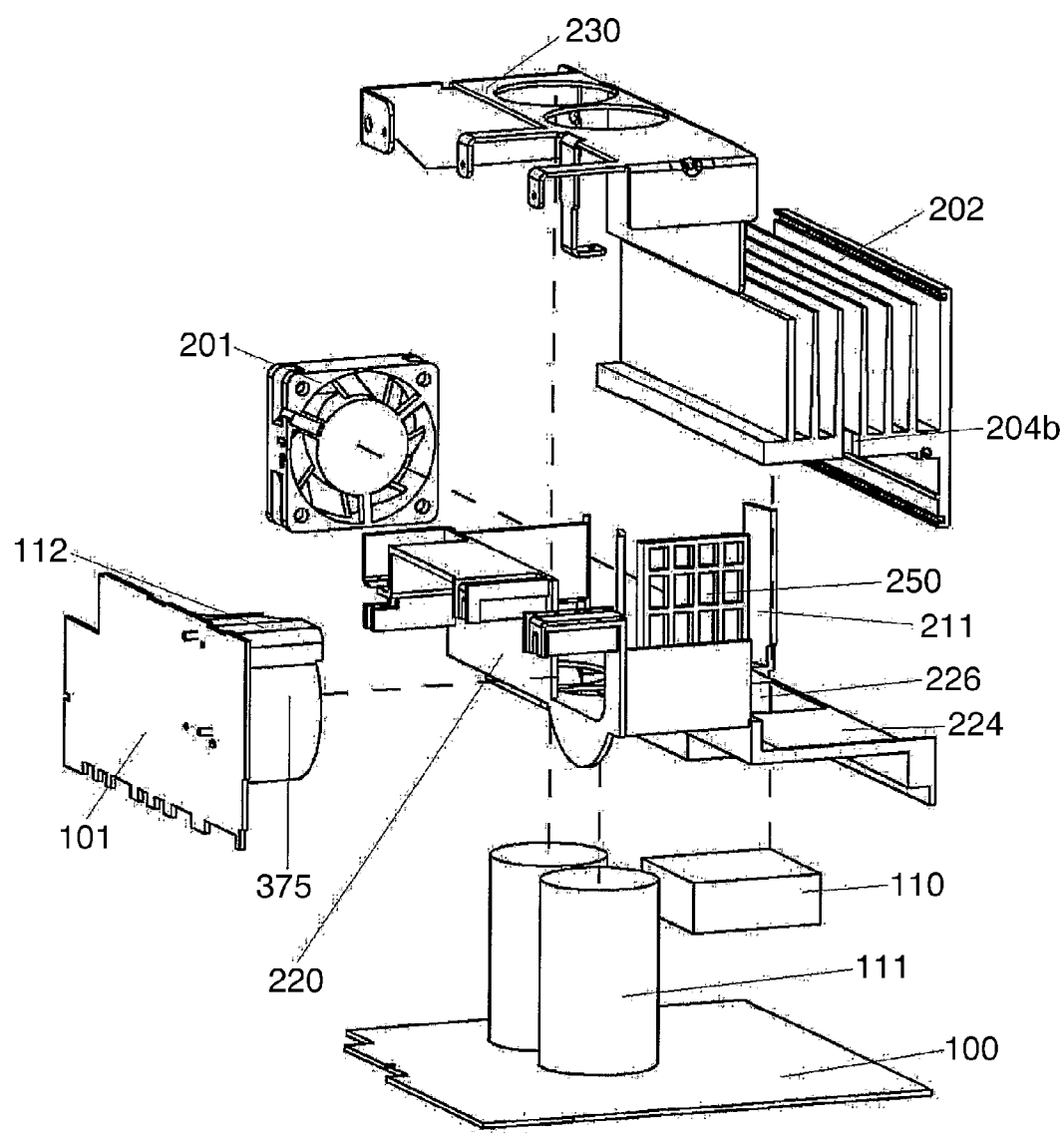
FIG. 10A is an exploded perspective view of the structure of the frequency converter with the airflow guiding member, the separating member, the heat insulation member, bracket and flow-guiding gate according to the sixth embodiment of the present invention.
Figure 10B:
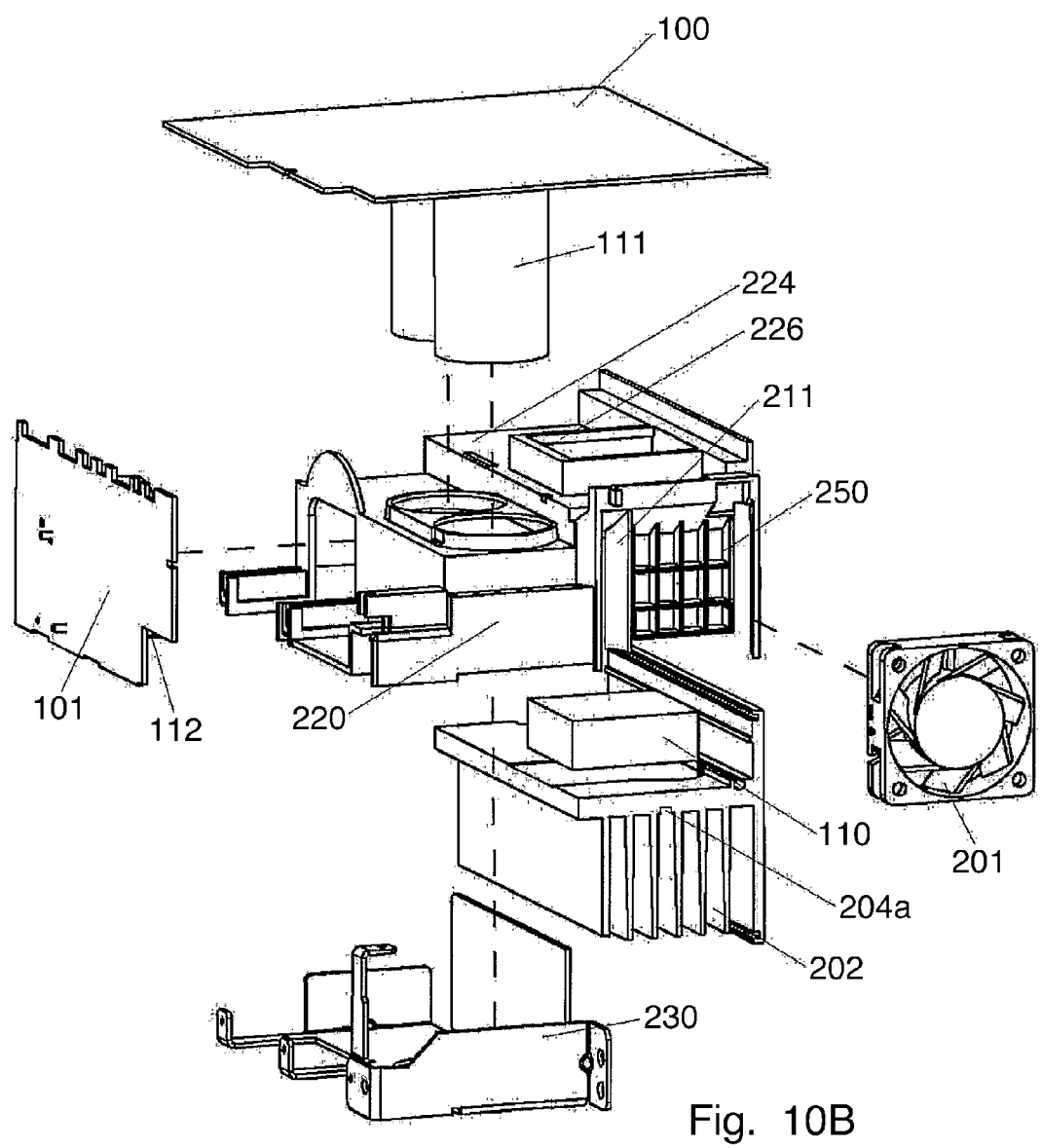
FIG. 10B is an upside-down rear exploded perspective view of FIG. 10A.

FIG. 10A is an exploded perspective view of the structure of the frequency converter with the airflow guiding member 211, the separating member 220, the heat insulation member 224, bracket 226 and flow-guiding gate 250 according to the sixth embodiment of the present invention, and FIG. 10B is an upside-down rear exploded perspective view of FIG. 10A.

Referring FIGS. 10A and 10B, the frequency converter according to the sixth embodiment of the present invention comprises: a circuit board 100, which has a IGBT model 110 as a main heat-generating element and a capacitor 111 as a secondary heat-generating element; sub circuit board 101, which has a coil 112 as another secondary heat-generating element, and the sub circuit board 101 and the circuit board 100 are disposed as substantially perpendicular to each other; a heat sink 202, which is disposed on the IGBT model 110; a fan 201, which is disposed on the case (not shown) of the frequency converter corresponding to the inlet end of the heat sink 202; an airflow guiding member 211, a separating member 220, a heat insulation member 224 and a bracket 226, which may integrally formed of the same insulating materials by injection molding for example; and flow-guiding gate 250, which guides more airflow from the fan 201 to a region of the heat sink corresponding to the IGBT model.

In the airflow-guiding member 211, the separating member 220, the heat insulation member 224 and the bracket 226, the airflow-guiding member 211 is disposed between the fan 201 and the heat sink 202 at the side adjacent to the capacitor 111, and dispenses the airflow from the fan 201 to the heat sink 202 and the capacitor 111 and the coil 112 respectively; the separating member 220 is disposed over the circuit board 100 for separating the main body of the capacitor 111 from the other elements on the circuit board; the heat insulation member 224 is disposed between the circuit board 100 and heat sink 202 to thermally insulate the circuit board 100 and the heat sink 202; the bracket 226 is disposed between the circuit board 100 and the heat sink 202 at the position corresponding to the IGBT model 110, for defining a mounting position of the IGBT model, thus thermally insulate the IGBT and the other elements on the circuit board 100, and preventing the other elements on the circuit board from damage due to the explosion of the IGBT 110.

The frequency converter of the present embodiment further comprises a conductive member 230 formed of metal materials, which is jointed with the separating member 220 to form a closed second airflow passage as described above, and the conductive member 230 further serves as a ground member of the frequency converter to eliminate electromagnetic interference.

The frequency converter further comprises a coil cover 375 accommodating the coil 112 is fixed on the sub circuit board 101 for separating the sub circuit board 101 and the coil 112. The coil cover 375 is connected to the second airflow passage describe above to become a part of the second airflow passage, so that the coil 112 is positioned in the second airflow passage to be cooled.

In the frequency converter, a heat insulation film (not shown) is disposed on the backboard of the heat sink 202 at the position corresponding to the heat insulation member 224, with a predetermined distance between the heat sink 202 and the heat insulation member 224. An inlet hole 204a and an outlet hole 204b are disposed at the both ends of the heat sink respectively. The airflow from the fan 201 is introduced into the space between the heat sink 202 and the heat insulation member 224 through the inlet hole 204a, and discharged out of the frequency converter through the outlet hole 204b. Thus, a cooling airflow passage is formed in the space between the heat sink 202 and the heat insulation member 224, to prevent the heat of the heat sink from transferring to the circuit board.

The separating member and cooling device of the frequency converter according to the present invention may adapt not only to the frequency converter but also to any electronic device with two or more heat-generating elements.

The preferable embodiments of the present invention may be combined with any other embodiments and the alternative embodiments of the present invention to form new embodiments, which are all belong to the scope of the present invention. Those skilled in the art will appreciate that various modifications, additions and substitutions are possible, without departing from the scope and spirit of the invention. Therefore, the protection scope of the invention is defined by the claims and the equivalent thereof.

What is claimed is:

1. A frequency converter for driving a motor, comprising:
   a circuit board, having at least one first heat-generating element mounted thereon:
   at least one second heat-generating element having a main body protruding from the circuit board;
   a separating member for separating the at least one portion of the main body of the at least one second heat-generating element from the circuit board, so as to prevent cooling air guided to the at least one second heat-generating element from flowing to the circuit board;
   a heat sink, connected to the at least one first heat-generating element;
   a fan, facing the heat sink; and
   a bracket, for positioning the at least one first heat-generating element relative to the heat sink and the circuit board;
   wherein the separating member and the bracket are integrally formed of the same insulating materials.

2. The frequency converter for driving a motor as claimed in claim 1, further comprises a heat insulation member for separating the heat sink and the circuit board so as to thermally insulate the heat sink and the circuit board wherein preferably the heat insulation member is disposed in parallel with the backboard of the heat sink, and spaced apart by a predetermined distance and/or a heat insulation film is disposed on the backboard of the heat sink, wherein the heat insulation film preferably comprises insulating materials.

3. The frequency converter for driving a motor as claimed in claim 2, further comprising an airflow guiding member placed between the fan and the heat sink, for guiding the cooling air flowed from the fan to the heat sink and at least one portion of the at least one second heat-generating element respectively.

4. The frequency converter for driving a motor as claimed in claim 2, further comprising an airflow guiding member placed between the fan and the heat sink, for guiding the cooling air flowed from the fan to the heat sink and at least one portion of the at least one second heat-generating element respectively;
   wherein the airflow guiding member, the separating member, the heat insulation member and the bracket are integrally formed of the same insulating materials.

5. The frequency converter for driving a motor as claimed in claim 2, wherein the heat sink is provided with an inlet hole on the backboard of the inlet end, and an outlet hole on the backboard of the outlet end, so as to form part of an airflow passage between the heat sink and the heat insulation member.

6. The frequency converter for driving a motor as claimed in claim 2, wherein the backboard of the inlet end of the heat sink is separated from the heat insulation member by a predetermined distance to form an inlet gap, and the backboard of the outlet end of the heat sink is separated from the heat insulation member by a predetermined distance to form an outlet gap, so as to form an airflow passage between the heat sink and the heat insulation member.

7. The frequency converter for driving a motor as claimed in claim 1, further comprising an airflow guiding member placed between the fan and the heat sink, for guiding the cooling air flowed from the fan to the heat sink and at least one portion of the at least one second heat-generating element respectively;
   wherein the heat sink defines a first airflow passage, and the separating member defines a second airflow passage in which the at least one portion of the main body of the at least one second heat-generating element is positioned, so that the cooling air guided to the at least one second heat-generating element flows through the second airflow passage, and cools the at least one portion of the main body of the at least one second heat-generating element, wherein the second airflow passage preferably has an inlet hole adjacent to the airflow guiding member and an outlet hole for guiding the airflow out of the frequency converter.

8. The frequency converter for driving a motor as claimed in claim 7, wherein a conductive member is provided on the separating member to eliminate electromagnetic interference, which is in particular formed of metal material different from the material for the heat sink and preferably the conductive member is a conductive film layer formed on at least one portion of the separating member.

9. The frequency converter for driving a motor as claimed in claim 7, wherein the heat sink has fin-like shape, and comprises a plurality of fin plates substantially extending in parallel for defining the first airflow passage between each fin plates, the first air-flow passage comprises an inlet end adjacent to the fan and an outlet end for guiding the airflow out of the frequency converter, wherein the fan and the inlet end are preferably spaced apart by a predetermined distance to reduce wind resistance.

10. The frequency converter for driving a motor as claimed in claim 7, wherein the airflow guiding member and the second airflow passage are configured as a streamline shape to eliminate vortex.

11. The frequency converter for driving a motor as claimed in claim 1, further comprising a metal sheet matching with the separating member, which on one hand functions as an electromagnetic proof member, and on the other hand defines a second airflow passage together with the separating member, at least one portion of the main body of the at least one second heat-generating element being positioned in the second airflow passage, so that the cooling air guided to the at least one second heat-generating element flows through the second airflow passage.

12. The frequency converter for driving a motor as claimed in claim 11, further comprising an airflow guiding member placed between the fan and the heat sink, for guiding the cooling air flowed from the fan to the heat sink and at least one portion of the at least one second heat-generating element respectively;
wherein the second airflow passage has an inlet hole adjacent to the airflow guiding member and an outlet hole for guiding the airflow out of the frequency converter.

13. The frequency converter for driving a motor as claimed in claim 1, wherein the heat sink defines a first airflow passage, and wherein the frequency converter further comprises a flow guiding gate disposed between the fan and the heat sink for guiding airflow from the fan to the heat sink, and dispensing more airflow to flow through a region of the heat sink corresponding to the at least one first heat-generating element in the first airflow passage.

14. The frequency converter for driving a motor as claimed in claim 1, wherein the at least one first heat-generating element comprises at least one IGBT, and the at least one second heat-generating element comprises at least one capacitor.

15. The frequency converter for driving a motor as claimed in claim 14, wherein the at least one first heat-generating element further comprises metal oxide semiconductor field effect transistor, and the at least one second heat-generating element further comprises a coil.

16. The frequency converter for driving a motor as claimed in claim 1, wherein the bracket comprises an insulating wall surrounding the at least one first heat-generating element for thermally insulating the at least one first heat-generating element from the elements on the circuit board therearound.

* * * * *